US009659998B1

(12) United States Patent
Lung

(10) Patent No.: US 9,659,998 B1
(45) Date of Patent: May 23, 2017

(54) MEMORY HAVING AN INTERLAYER INSULATING STRUCTURE WITH DIFFERENT THERMAL RESISTANCE

(71) Applicant: MACRONIX INTERNATIONAL CO., LTD., Hsinchu (TW)

(72) Inventor: Hsiang-Lan Lung, Ardsley, NY (US)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 0 days.

(21) Appl. No.: 15/175,859

(22) Filed: Jun. 7, 2016

(51) Int. Cl.
*H01L 47/00* (2006.01)
*H01L 27/24* (2006.01)
*H01L 23/528* (2006.01)
*H01L 45/00* (2006.01)
*G11C 13/00* (2006.01)

(52) U.S. Cl.
CPC ...... *H01L 27/2481* (2013.01); *G11C 13/0004* (2013.01); *H01L 23/528* (2013.01); *H01L 27/2427* (2013.01); *H01L 45/06* (2013.01); *H01L 45/1233* (2013.01); *H01L 45/1246* (2013.01); *H01L 45/1293* (2013.01); *H01L 45/142* (2013.01); *H01L 45/143* (2013.01); *H01L 45/144* (2013.01); *H01L 45/1608* (2013.01); *G11C 13/004* (2013.01); *G11C 13/0026* (2013.01); *G11C 13/0028* (2013.01); *G11C 13/0069* (2013.01); *G11C 2213/51* (2013.01); *G11C 2213/71* (2013.01); *G11C 2213/72* (2013.01)

(58) Field of Classification Search
USPC .......... 257/295, E43.001–E43.007, 257/E27.005–E27.006, E27.008, E29.164, 257/E29.167, E29.272, E29.323, E21.436, 257/E21.663–E21.665, 68–71, 296–309, 257/905–908, E21.646–E21.66, 314–326, 257/E27.078, E29.3–E29.309, 257/E21.179–E21.182, E21.209–E21.21, 257/E21.422, E21.679–E21.694; 438/3, 438/785, E21.208
See application file for complete search history.

(56) References Cited

U.S. PATENT DOCUMENTS 6,815,704 B1   11/2004   Chen
7,893,418 B2    2/2011   Lung
7,932,101 B2    4/2011   Lung
(Continued)

OTHER PUBLICATIONS

Kau, et al., "A stackable cross point phase change memory," 2009 International Electron Devices Meeting, Baltimore MD, Dec. 7-9, 2009, pp. 27.1.1-27.1.4.

(Continued)

*Primary Examiner* — Tram H Nguyen
(74) *Attorney, Agent, or Firm* — Haynes Beffel & Wolfeld LLP

(57) ABSTRACT

An integrated circuit memory comprises an intermediate layer disposed between a plurality of bit lines in a bit line conductor layer and a plurality of word lines in a word line conductor layer. The intermediate layer includes a plurality of memory posts through an interlayer insulating structure. Each memory post has a memory element and an access element. The interlayer insulating structure includes higher thermal resistance at the level of the memory element than at the level of the access element.

20 Claims, 13 Drawing Sheets

(56) References Cited

U.S. PATENT DOCUMENTS

| | | | |
|---|---|---|---|
| 7,964,468 B2 | 6/2011 | Lung et al. | |
| 8,021,897 B2 * | 9/2011 | Sills | H01L 27/2463 |
| | | | 257/211 |
| 8,097,487 B2 | 1/2012 | Lung | |
| 8,106,376 B2 | 1/2012 | Lai et al. | |
| 8,110,822 B2 | 2/2012 | Chen | |
| 8,237,144 B2 | 8/2012 | Lung et al. | |
| 8,350,316 B2 | 1/2013 | Lung et al. | |
| 8,946,669 B1 * | 2/2015 | Jo | H01L 27/2436 |
| | | | 257/2 |
| 8,981,330 B2 | 3/2015 | Lung | |
| 2005/0254291 A1 * | 11/2005 | Happ | G11C 13/0011 |
| | | | 365/163 |
| 2011/0260131 A1 * | 10/2011 | Sonehara | H01L 27/2409 |
| | | | 257/2 |
| 2012/0305522 A1 * | 12/2012 | Park | H01L 45/06 |
| | | | 216/13 |
| 2013/0003437 A1 * | 1/2013 | Siau | G11C 11/5685 |
| | | | 365/148 |

OTHER PUBLICATIONS

Li et al., "Evaluation of SiO2 Antifuse in a 3D-OTP Memory," IEEE Transaction on Device and Materials Reliability, vol. 4 No. 3, Sep. 2004, 6 pages.

Sasago, et al., "Cross-point phase change memory with 4F2 cell size driven by low-contact-resistivity poly-Si diode," 2009 Symp. on VLSI Technology, Jun. 16-18, 2009, 2 pages.

* cited by examiner

MEMORY HAVING AN INTERLAYER INSULATING STRUCTURE WITH DIFFERENT THERMAL RESISTANCE

BACKGROUND

Technical Field

This technology relates to integrated circuit memory technologies, including technologies using phase change materials and methods for manufacturing such devices.

Description of Related Art

Many three dimensional (3D) memory technologies using phase change material, and other programmable resistance materials have been proposed in order to make high density memory. For example, Li et al., "Evaluation of $SiO_2$ Antifuse in a 3D-OTP Memory," IEEE TRANSACTIONS ON DEVICE AND MATERIALS RELIABILITY, VOL. 4, NO. 3, SEPTEMBER 2004, describes a polysilicon diode and an anti-fuse arranged as a memory cell. Sasago et al., "Cross-point phase change memory with $4F^2$ cell size driven by low-contact-resistivity poly-Si diode," 2009 Symposium on VLSI Technology Digest of Technical Papers, pages 24-25, describes a polysilicon diode and a phase change element arranged as a memory cell. Kau et al., "A stackable cross point phase change memory," IEDM09-617, (2009) pages 27.1.1 to 27.1.4, describes a memory post including an ovonic threshold switch OTS as an access device with a phase change element. These technologies rely on a combination of an access device and a memory element to construct the memory cell.

For setting and resetting programmable resistance materials, thermal processes can be used in which heat is generated in an active region of the memory material to cause changes in resistance. For phase change materials, the change in resistance can be induced by causing a transition between a crystalline solid phase and an amorphous solid phase. The heat is typically produced by applying a current through the active region of the programmable resistance material. If the surroundings of the memory element dissipate the heat quickly, a larger amount of power is needed to compensate for the dissipated heat, and reach the temperatures needed. To achieve higher powers in these settings, higher current density is needed in the active region.

Therefore, it is desirable to provide a memory technology that is suitable for high density structures, and lower operating current.

SUMMARY

An architecture for a programmable resistance memory is described, suitable for phase change memory and other memory technologies requiring improved thermal isolation of the memory elements.

An integrated circuit described herein includes a plurality of bit lines disposed in a bit line conductor layer, a plurality of word lines disposed in a word line conductor layer, and an intermediate layer between the bit line conductor layer and the word line conductor layer. The intermediate layer includes an interlayer insulating structure and a plurality of memory posts through the interlayer insulating structure, each memory post in the plurality of memory posts having one end in contact with a bit line in the plurality of bit lines, and a second end in contact with a word line in the plurality of word lines, the memory posts respectively including an access element and a memory element arranged in respective levels of the interlayer insulating structure. The interlayer insulating structure has higher thermal resistance at the level of the memory elements than at the level of the access elements.

An integrated circuit described herein includes a plurality of bit line conductor layers and a plurality of word line conductor layers interleaved with the plurality of bit line conductor layers, each bit line conductor layer in the plurality of bit line conductor layers having a plurality of bit lines disposed therein and each word line conductor layer in the plurality of word line conductor layers having a plurality of word lines disposed therein. The integrated circuit further includes a plurality of intermediate layers, each intermediate layer being disposed between one of the bit line conductor layers and one of the word line conductor layers, each intermediate layer in the plurality including an interlayer insulating structure and an array of memory posts through the interlayer insulating structure, each memory post in the array having a first end in contact with a bit line in the plurality of bit lines in an adjacent bit line conductor layer, and a second end in contact with a word line in the plurality of word lines in an adjacent word line conductor layer, the memory posts respectively including an ovonic threshold switch and a phase change memory element arranged in respective levels of the intermediate layer, the interlayer insulating structure having higher thermal resistance at the level of the phase change memory elements than at the level of the ovonic threshold switches.

A method of manufacturing an integrated circuit described herein comprises:

forming a plurality of bit lines disposed in a bit line conductor layer and a plurality of word lines disposed in a word line conductor layer; and forming an intermediate layer between the bit line conductor layer and the word line conductor layer, wherein said forming the intermediate layer includes forming an interlayer insulating structure and forming a plurality of memory posts through the insulating structure, each memory post in the plurality of memory posts having a first surface in contact with a bit line in the plurality of bit lines, and a second surface in contact with a word line in the plurality of word lines, the memory posts respectively including an access element and a memory element arranged in the interlayer insulating structure, the interlayer insulating structure having higher thermal resistance at the level of the memory elements than at the level of the access elements.

Other aspects and advantages of the technology described herein can be understood with reference to the figures, the detailed description and the claims set out below.

BRIEF DESCRIPTION OF THE DRAWINGS

FIG. 17 is a block diagram of an integrated circuit with a 3D memory array having an interlayer insulating structure as described in.

DETAILED DESCRIPTION

Detailed descriptions of embodiments of programmable resistance memory devices and of methods of manufacturing such devices are provided with reference to FIGS. 1-11.

Figure 1:
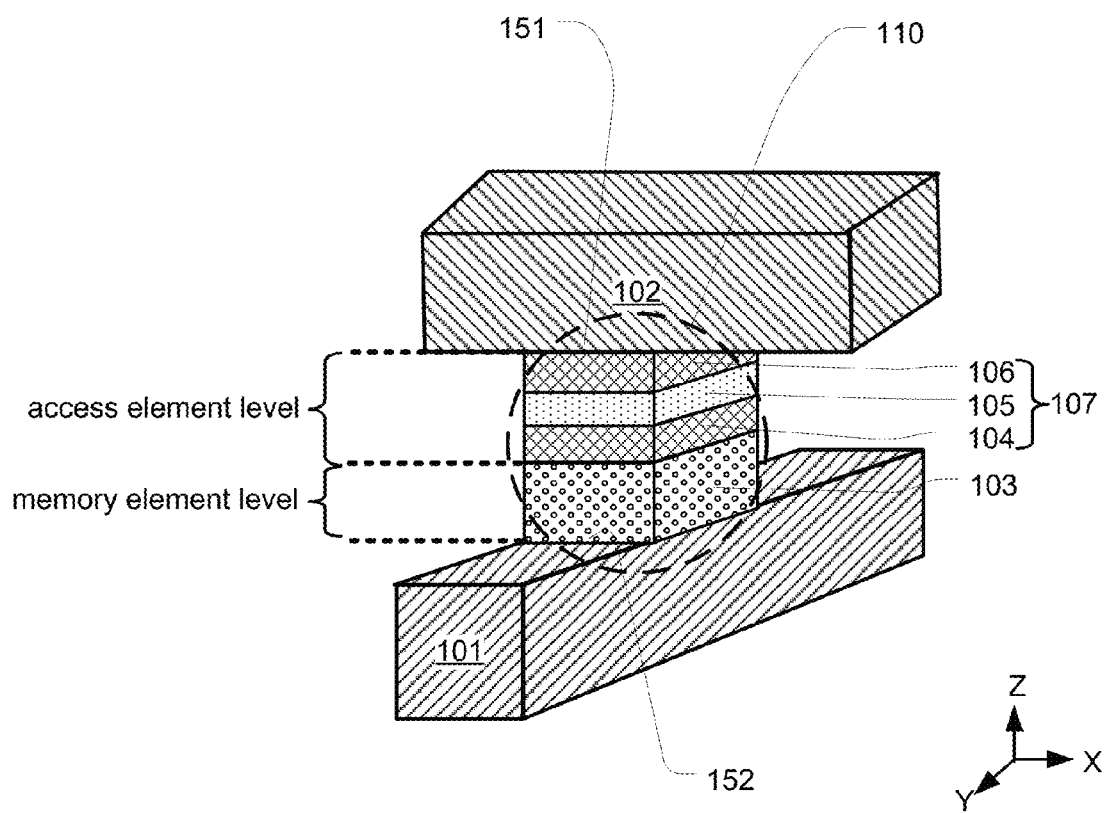
FIG. 1 shows a perspective view of a simplified memory post in one embodiment.

FIG. 1 is a perspective view of a memory post in a cross-point array. The cross-point array comprises a plurality of bit lines, including bit line 102, disposed in a bit line conductor layer, and comprises a plurality of word lines, including word line 101, disposed in a word line conductor layer. An intermediate layer is interposed between the bit line conductor layer and the word line conductor layer, and comprises an interlayer insulating structure and a plurality of memory posts, including memory post 110, through the insulating structure. Memory post 110 has a first end 151 in contact with bit line 102, and has a second end 152 in contact with word line 101. Memory post 110 includes an access element 107 and a memory element 103 arranged in respective levels of the interlayer insulating structure. The interlayer insulating structure has higher thermal resistance at the level of the memory elements than at the level of the access elements.

In another embodiment, the memory post is inverted, so that the first end can be in contact with the word line and the second end can be in contact with the bit line.

The interlayer insulating structure (not shown in FIG. 1) surrounds the memory posts in the array so as to separate one memory post from an adjacent memory post in the plurality.

Access element 107 can be a two-terminal, bi-directional switching device, comprising a first barrier layer 104, a switching layer 105, and a second barrier layer 106. Access element 107, for example, can be an ovonic threshold switch (OTS) which comprises a chalcogenide interposed between barrier layers. In other embodiments, the access element can comprise other types of devices, such as a vertical transistor or a vertical diode.

In one example, switching layer 105 can comprise a chalcogenide, such as $As_2Se_3$, ZnTe, and GeSe. Switching layer 105 has for example a thickness of about 5 nm to about 25 nm, preferably about 15 nm. The amorphous chalcogenide-based material used for switching layer 105 forms an ovonic threshold switch (OTS), and may have superior conductivity and current mobility to the material used for memory element 103. Switching layer 105 can comprise a chalcogenide combination including one or more elements from the group comprising tellurium (Te), selenium (Se), germanium (Ge), silicon (Si), arsenic (As), titanium (Ti), sulfur (S) and antimony (Sb).

First barrier layer 104 provides adequate adhesion between switching layer 105 and memory element 103. First barrier layer 104 may have a layer of conductive material with a thickness of about 5 to about 50 nm, preferably about 20 nm. First barrier layer 104 may comprise a metal nitride, for example, titanium nitride (TiN), tantalum nitride (TaN), tungsten nitride (WN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (WAlN), tantalum silicon nitride (TaSiN), tantalum aluminum nitride (TaAlN). In addition to metal nitrides, first barrier layer 104 may also comprise doped polysilicon, tungsten (W), copper (Cu), titanium (Ti), molybdenum (Mo), tantalum (Ta), titanium silicide (TiSi), tantalum silicide (TaSi), titanium tungsten (TiW), titanium oxynitride (TiON), titanium aluminum oxynitride (TiAlON), tungsten oxynitride (WON), and tantalum oxynitride (TaON).

Second barrier layer 106 provides adequate adhesion between switching layer 105 and bit line 102. Second barrier layer 106 may have a layer of conductive material with a thickness of about 5 to about 40 nm, preferably about 15 nm. Second barrier layer 106 material may comprise a metal nitride, for example, titanium nitride (TiN), tantalum nitride (TaN), tungsten nitride (WN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (WAlN), tantalum silicon nitride (TaSiN), tantalum aluminum nitride (TaAlN). In addition to metal nitrides, second barrier layer 106 may also comprise doped polysilicon, tungsten (W), copper (Cu), titanium (Ti), molybdenum (Mo), tantalum (Ta), titanium silicide (TiSi), tantalum silicide (TaSi), titanium tungsten (TiW), titanium oxynitride (TiON), titanium aluminum oxynitride (TiAlON), tungsten oxynitride (WON), and tantalum oxynitride (TaON).

In this example, second barrier layer 106 has the same material as first barrier layer 104, such as TiN. In another example, second barrier layer 106 has a different material than first barrier layer 104.

Memory element 103 may include programmable resistance material, for example, a layer of phase change material having a thickness of about 10 nm to about 50 nm, preferably about 30 nm. The thickness of the phase change memory element is greater than the thickness of switching layer 105. Memory element 103 can comprise, for example, $Ge_2Sb_2Te_5$, in a pure stoichiometric form or in a form including additives or dopants.

Embodiments of phase change materials include chalcogenide-based materials and other materials. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Ge_aSb_bTe_{100-(a+b)}$, for example $Ge_2Sb_2Te_5$, $GeSb_2Te_4$ and $GeSb_4Te_7$. More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky, U.S. Pat. No. 5,687,112 at columns 11-13, which examples are hereby incorporated by reference.

Chalcogenides and other phase change materials are doped with, or include additives of, impurities in some embodiments to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium, and titanium oxide.

Phase change materials are capable of being switched between a first structural state in which the material is in a generally high resistivity, amorphous solid phase, and a second structural state in which the material is in a generally low resistivity, crystalline or polycrystalline solid phase in its local order in the active channel region of the cell. These materials are at least bi-stable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase.

The materials chosen for word line 101 and bit line 102 can comprise a variety of metals, metal-like materials and doped semiconductors, and combinations thereof. Word line 101 and bit line 102 can be implemented using one or more layers of materials like tungsten (W), aluminum (Al), copper (Cu), titanium nitride (TiN), tantalum nitride (TaN), tungsten nitride (WN), doped polysilicon, cobalt silicide (CoSi), Tungsten silicide (WSi) and other materials. For example, the thicknesses of the word lines and bit lines in the pluralities can range from 10 to 100 nm. In other embodiments, the word lines and bit lines in the pluralities are very thin, or much thicker. The material selected for the word lines is preferably selected for compatibility with the memory elements. Likewise, the material selected for the bit lines is preferably selected for compatibility with the second barrier layer 106. In this example, the word lines and bit lines in the pluralities respectively are comprised of TiN/W/TiN.

The conductors can be formed on an integrated circuit using a variety of known techniques, including chemical vapor deposition, physical vapor deposition or sputtering, atomic layer deposition and so on. Photolithography and other patterning techniques can be used to form the bit lines and word lines in the conductor layers. In another embodiment, a bottom electrode (not shown) having a smaller contact surface than the surface of the memory element to increase the current density at the electrode contact is interposed between memory element 103 and word line 101. In yet another embodiment, a bottom electrode is interposed between memory element 103 and access element 107. The bottom electrode may comprise titanium nitride (TiN), tantalum nitride (TaN), titanium silicon nitride (TiSiN), titanium aluminum nitride (TiAlN), tantalum aluminum nitride (TaAlN), and tungsten nitride (WN). The electrode in contact with the active region of the phase change material is sometimes referred to as a "heater", reflecting embodiments in which the electrode can have relatively high resistance, and contributes to the Joule heating in the active region of the phase change material.

Figure 2:
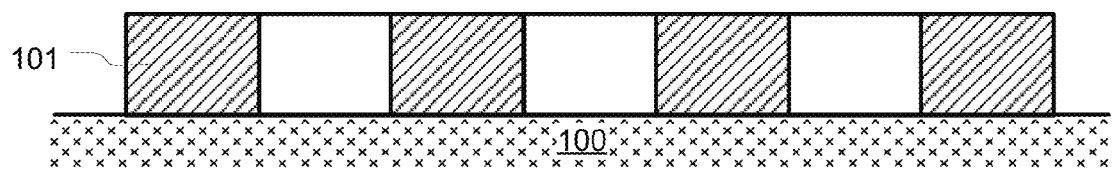
FIGS. 2, 3, 4, 4A, 5, 5A, 6 and 6A illustrate stages of an example process flow for an array of memory posts as described in FIG. 1.

FIGS. 2 through 6A illustrate stages of an example process flow for manufacturing an array of memory posts as described in FIG. 1. Reference numerals used in FIG. 1 are generally applied in FIGS. 2-6A and not described again. FIG. 2 illustrates a stage of the process flow after forming a plurality of word lines in a word line conductor layer To form the structure shown in FIG. 2, a layer of material suitable for word lines is deposited over a substrate 100, followed by depositing a layer of photoresist, and followed by patterning the layer of photoresist on the dielectric layer using standard photolithographic techniques so as to form a mask of photoresist overlying the locations of word lines. Next, the mask of photoresist is formed overlying the locations of the plurality of word lines. Then the word line conductor layer is etched using the mask of photoresist. A layer of dielectric material is then deposited and planarized to form the plurality of the word lines, including word line 101, in the word line conductor layer.

Alternatively, the dielectric layer can be first formed, followed by patterning the dielectric layer using a mask of photoresist to define the locations of the word lines. A conductor layer suitable for word lines is then deposited to the locations of word lines, followed by planarizing the surface using a CMP process to form the plurality of word lines disposed in the word line conductor layer.

Figure 3:
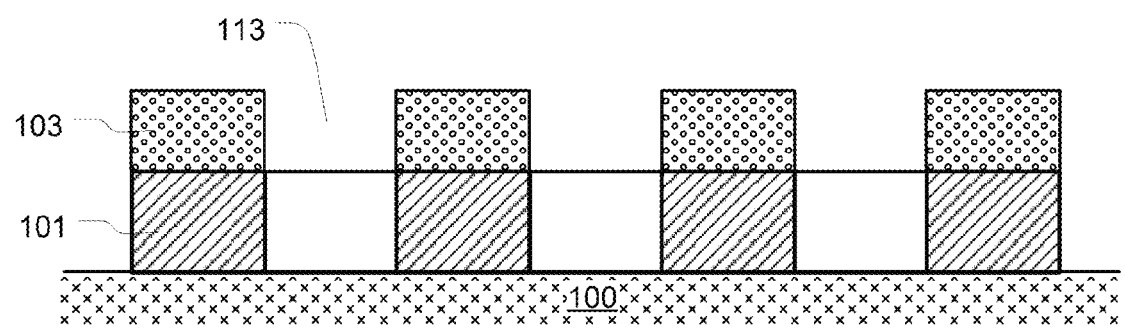

FIG. 3 illustrates a stage of the process flow after forming a plurality of memory elements, including memory element 103. A layer of phase change material is deposited using physical vapor deposition (PVD) sputtering or a magnetron-sputtering method with source gas(es) of Ar, $N_2$, and/or He, etc. at the pressure of 1 mTorr~100 mTorr, for example. Alternatively, the phase change material also can be formed using chemical vapor deposition (CVD). Additives can be included in the phase change material by sputtering, or by other methods. Thus, the phase change material comprises a chalcogenide or a chalcogenide with one or more additives selected from a group including silicon, oxygen, nitrogen and carbon. Next, a layer of photoresist is formed on the layer of phase change material and followed by patterning the layer of photoresist to form a mask of photoresist overlying the locations of the plurality of memory elements. The phase change layer is then etched away, using the mask of photoresist, to expose the surface of the dielectric layer to form opening 113. After the mask of photoresist is removed, a plurality of memory elements, including memory element 103, is formed.

Figure 4:
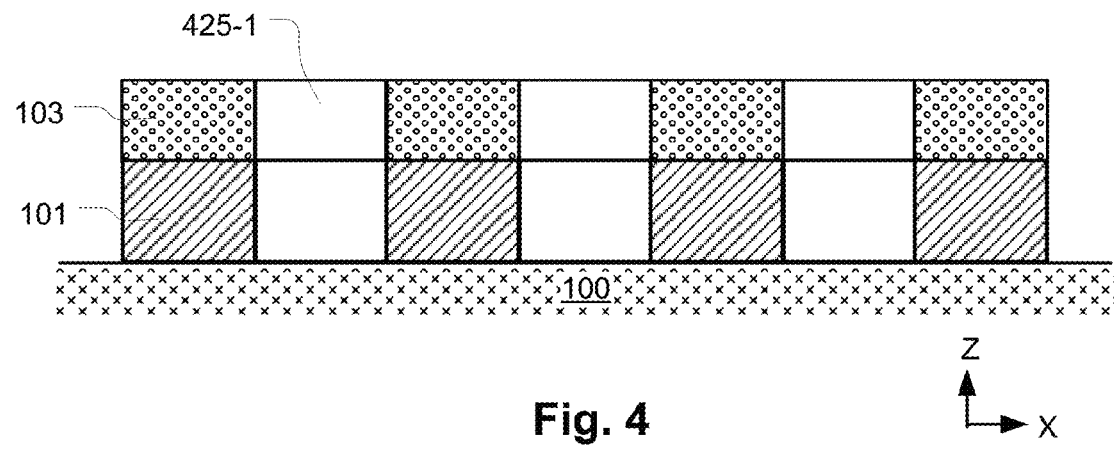

FIG. 4 illustrates a stage of the process flow after forming an interlayer insulating structure at the level of the memory elements. Opening 113 (see, FIG. 3) is completely filled with a first insulating material 425-1. First insulating material 425-1 can comprise silicon nitride and is formed using chemical vapor deposition (CVD). Other materials chosen for first insulating material 425-1 can comprise elements selected from a group including silicon (Si), carbon (C), oxygen (O), fluorine (F), and hydrogen (H), such as SiCOH, polyimide, polyamide, fluorocarbon polymers, fluorinated $SiO_2$, silsesquioxane, polyarylene ethers, poly-p-xylene, fluoro-polymers, fluorinated amorphous carbon, diamond like carbon, porous silica, mesoporous silica, porous silsesquioxane, porous polyimide, and porous polyarylene ethers. Also, other procedures, such as atomic layer deposition (ALD), physical vapor deposition (PVD), low-pressure chemical vapor deposition (LPCVD) or high density plasma chemical vapor deposition (HDPCVD) could be used to deposit the first insulating material, depending on materials and geometries involved.

Figure 4A:
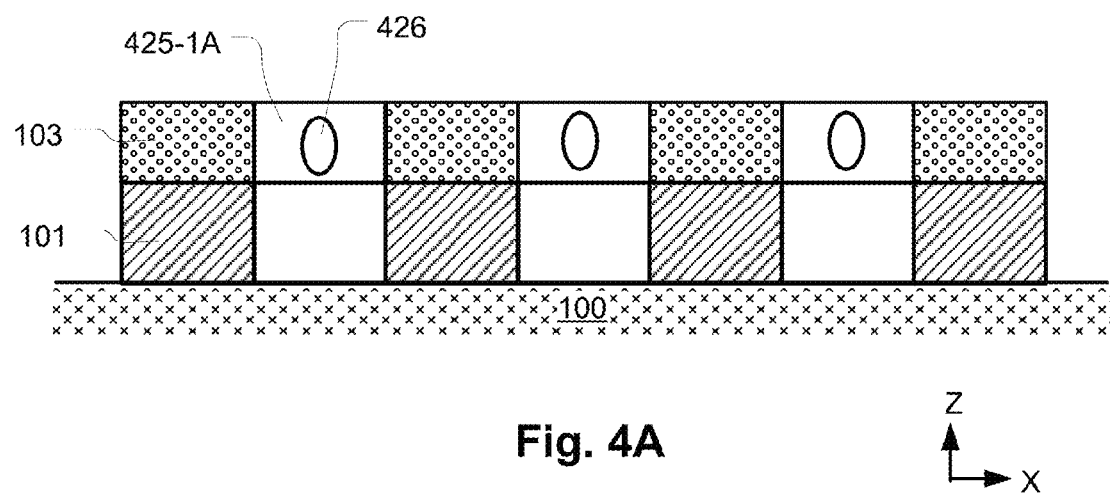

FIG. 4A illustrates a variant of the embodiment of FIG. 4, in which the interlayer insulating structure includes a plurality of voids at the level of the memory elements. In the illustrated embodiment in FIG. 4A, a first insulating layer 425-1A is formed with a dielectric material comprising a plurality of voids (e.g. 426) within opening 113. During the deposition, overhangs (not shown) may be formed by a process that grows the dielectric material on the top of the inside surface, resulting in the formation of a plurality of voids, including void 426, when two adjacent overhangs are very close or connected together so that the top of opening 113 closes before the interior is filled. First insulating material 425-1A can comprise silicon oxide, silicon nitride, and other materials including elements selected from a group comprising silicon (Si), carbon (C), oxygen (O), fluorine (F), and hydrogen (H), such as SiCOH, polyimide, polyamide, fluorocarbon polymers, fluorinated $SiO_2$, silsesquioxane, polyarylene ethers, poly-p-xylene, fluoro-polymers, fluorinated amorphous carbon, diamond like carbon, porous silica, mesoporous silica, porous silsesquioxane, porous polyimide, and porous polyarylene ethers. The materials chosen for first insulating material 425-1A as described above can be used using chemical vapor deposition (CVD) along with suitable deposition parameters to form the voids by adjusting deposition rate, temperature, and pressure. Other materials chosen for their ability to grow conformal layers within high aspect ratio openings could also be used for the dielectric material 425-1A. Also, other procedures, such as atomic layer deposition (ALD), physical vapor deposition (PVD), low-pressure chemical vapor deposition (LPCVD) or high density plasma chemical vapor deposition (HDPCVD) could be used to deposit the dielectric material 425-1, depending on materials and geometries involved.

Figure 5:
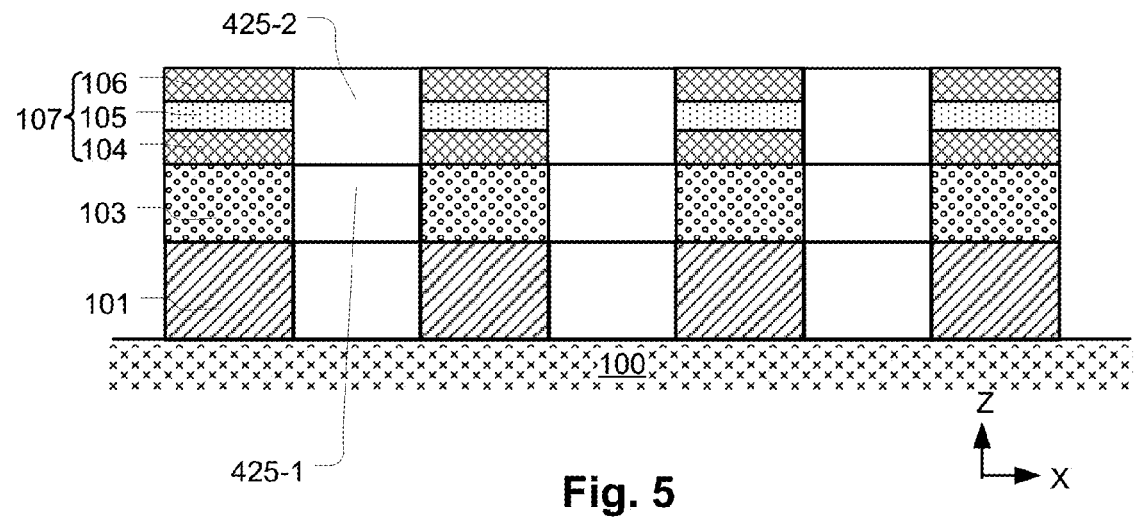

FIG. 5 illustrates a stage in the process following the structure of FIG. 4, and in which a plurality of access elements is formed and a second insulating layer 425-2 of the interlayer insulating structure is formed at the level of the access elements.

A first barrier layer 104, a switching layer 105, and a second barrier layer 106 are sequentially deposited on memory element 103 using suitable deposition techniques, followed by patterning of a layer of photoresist on second barrier layer 106 using standard photolithographic techniques so as to form a mask of photoresist defining the locations of the access elements. With the use of the photoresist mask, the multiple layer etch is performed and a plurality of access elements, including access element 107, is formed. A second insulating layer 425-2 comprising materials having lower thermal resistance than the materials chosen for the first insulating layer 425-1 can be formed. For example, the first insulating layer 425-1 may comprise silicon nitride, and the second insulating layer 425-2 may comprise silicon oxide. Some types of insulating layers can be formed using spin coating techniques. Other procedures, such as atomic layer deposition (ALD), physical vapor deposition (PVD), low-pressure chemical vapor deposition (LPCVD) or high density plasma chemical vapor deposition (HDPCVD) could be used to deposit second insulating layer 425-2.

First insulating layer (e.g. 425-1, 425-1A) and second insulating layer (e.g. 425-2) comprise materials chosen such that the first insulating layer has higher thermal resistance than the second insulating layer. The heat generated during the phase change from one state to another state is confined by this structure in the region of the phase change material, so that the interlayer insulating structure having a first insulating layer surrounding the memory element can reduce heat dissipation in the active region of the memory material, allowing lower current operations. In contrast, the access element, such as an ovonic threshold switch using an amorphous chalcogenide-based material, may require the surroundings to dissipate heat more efficiently so that, in the case of the ovonic threshold switch, the amorphous chalcogenide-based material will not be crystallized and not cause current leakage. As a result lower current operation and greater operating endurance can be achieved.

Figure 5A:
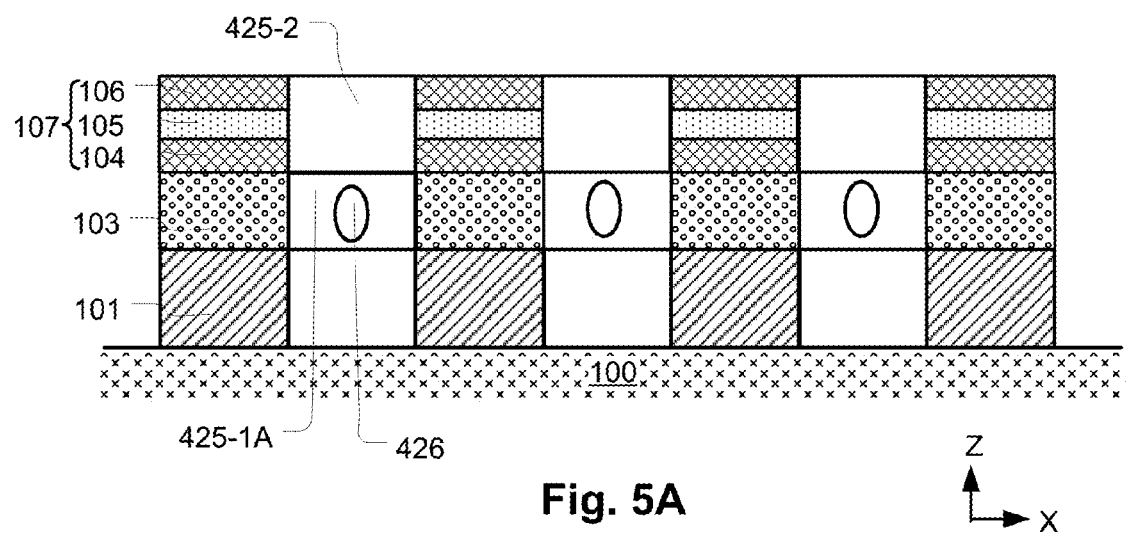

FIG. 5A illustrates a stage in the process following the structure of FIG. 4A, in which the access elements and the second insulating layer are formed as described with reference to FIG. 5. In one example, the second insulating layer 425-2 can comprise the same dielectric material formed in first insulating layer 425-1A because the dielectric material comprising a plurality of voids increases thermal resistance in first insulating layer 425-1A. In another example, the second insulating layer 425-2 can comprise materials different from the materials chosen for first insulating layer 425-1A such that first insulating layer 425-1A has higher thermal resistance than second insulating layer 425-2.

In the illustration shown in FIG. 5A, the first insulating layer (e.g. 425-1A) comprises a dielectric material having a plurality of voids (e.g. 426) at the level of the memory elements and the second insulting layer (e.g. 424) comprises a solid dielectric material without voids. In the illustration shown in FIG. 5, the first and second insulating layers comprise different solid dielectric materials.

Figure 6:
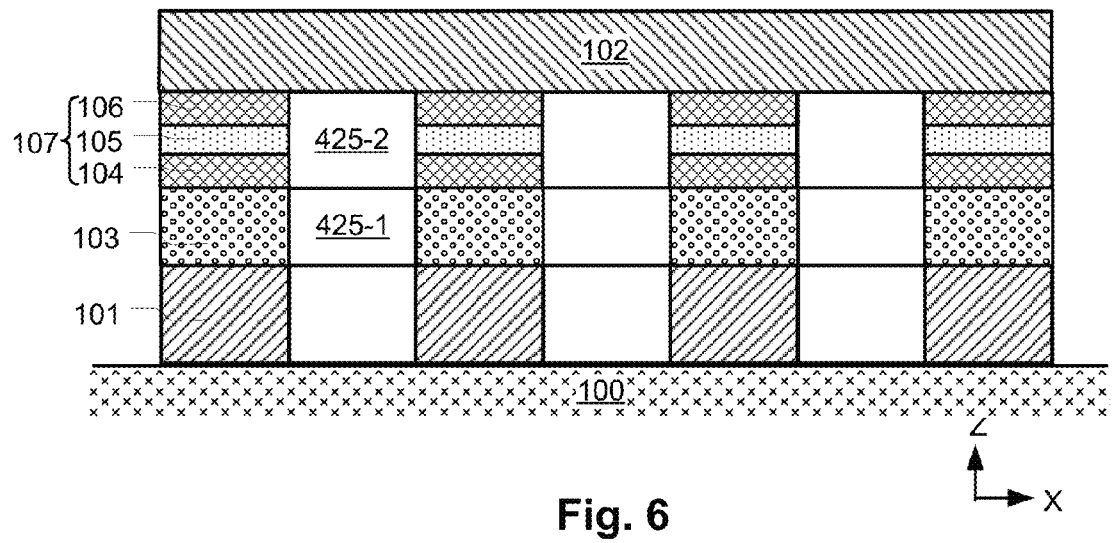
Figure 6A:
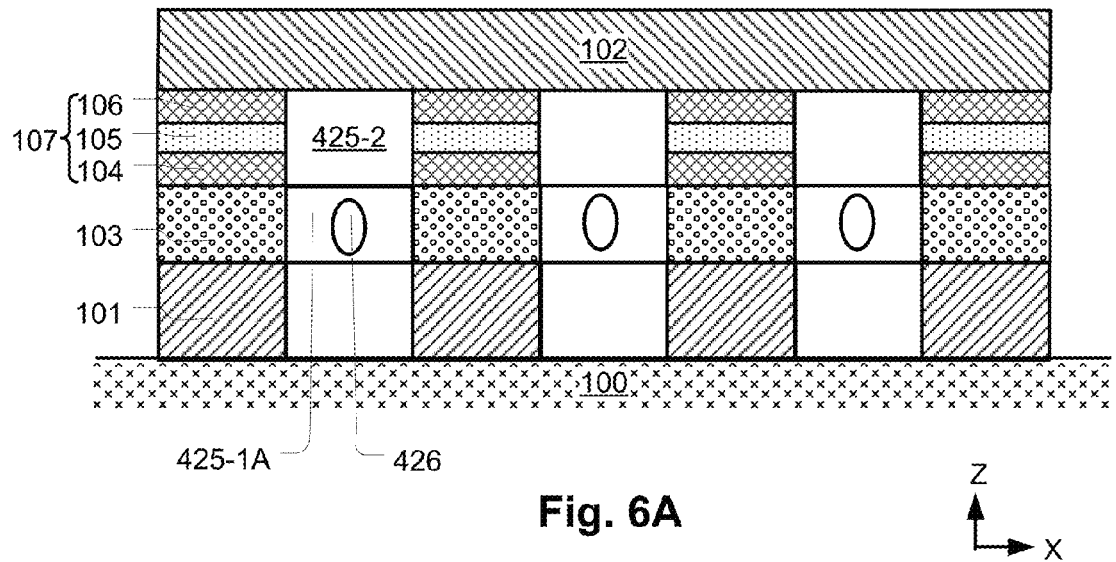

FIGS. 6 and 6A illustrate a stage of the process flow after forming a plurality of bit lines in a bit line conductor layer on the structures in FIGS. 5 and 5A, respectively.

Referring to FIGS. 6 and 6A, a layer of material suitable for bit lines is deposited over the memory posts and the interlayer insulating structure. A layer of photoresist is formed and then patterned to be a mask of photoresist overlying the locations of bit lines. The bit line conductor layer is etched using the mask of photoresist, forming a plurality of bit lines, including bit line 102, in the bit line conductor layer. A layer of dielectric material is then deposited and planarized.

Alternatively, the dielectric layer can be first formed, followed by patterning the dielectric layer using a mask of photoresist to define the locations of the bit lines. A conductor layer suitable for bit lines is then deposited to fill the locations of bit lines, followed by planarizing the surface using chemical mechanical polishing (CMP) techniques as known in the art.

The shapes and dimensions of the access elements and memory elements can vary with the designs and manufacturing conditions so that the access elements have a different width (or diameter) from the memory element.

Figure 7:
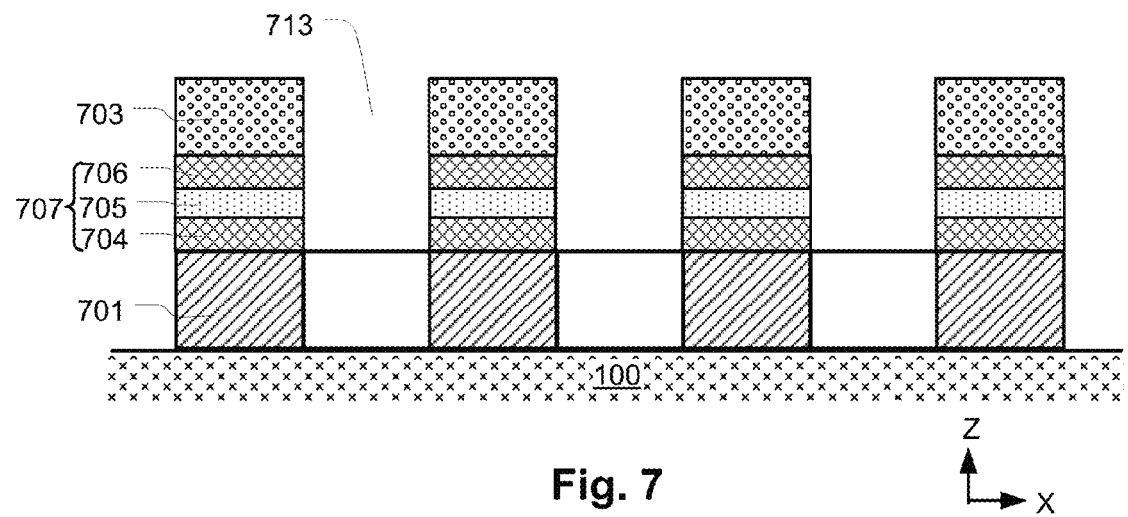
FIGS. 7, 8, and 9 illustrate stages of an example process flow for an array of memory posts in another embodiment.
Figure 8:
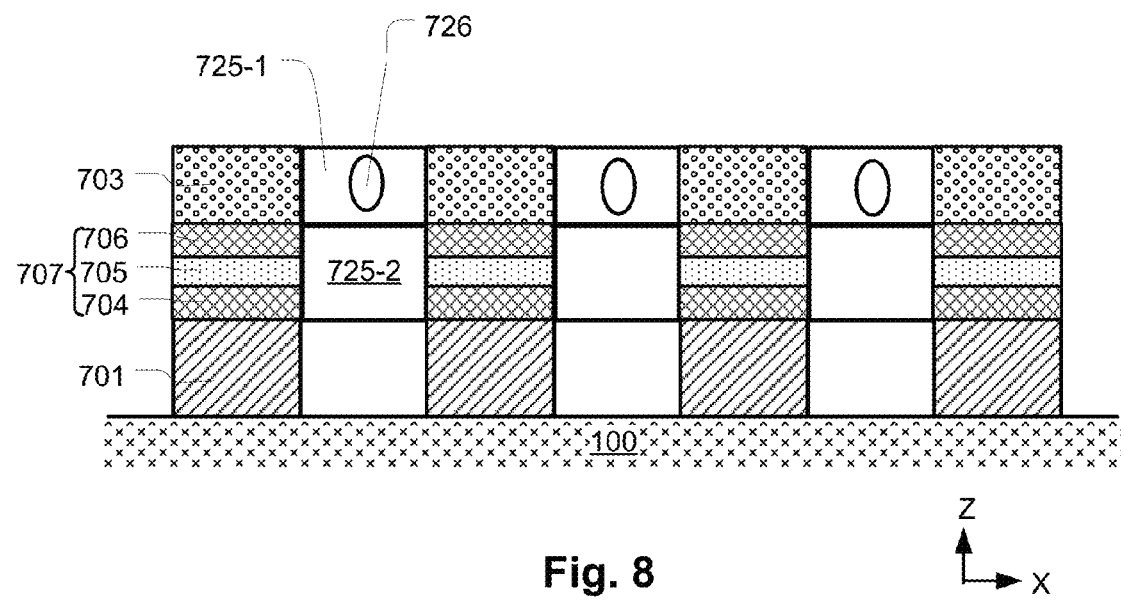
Figure 9:
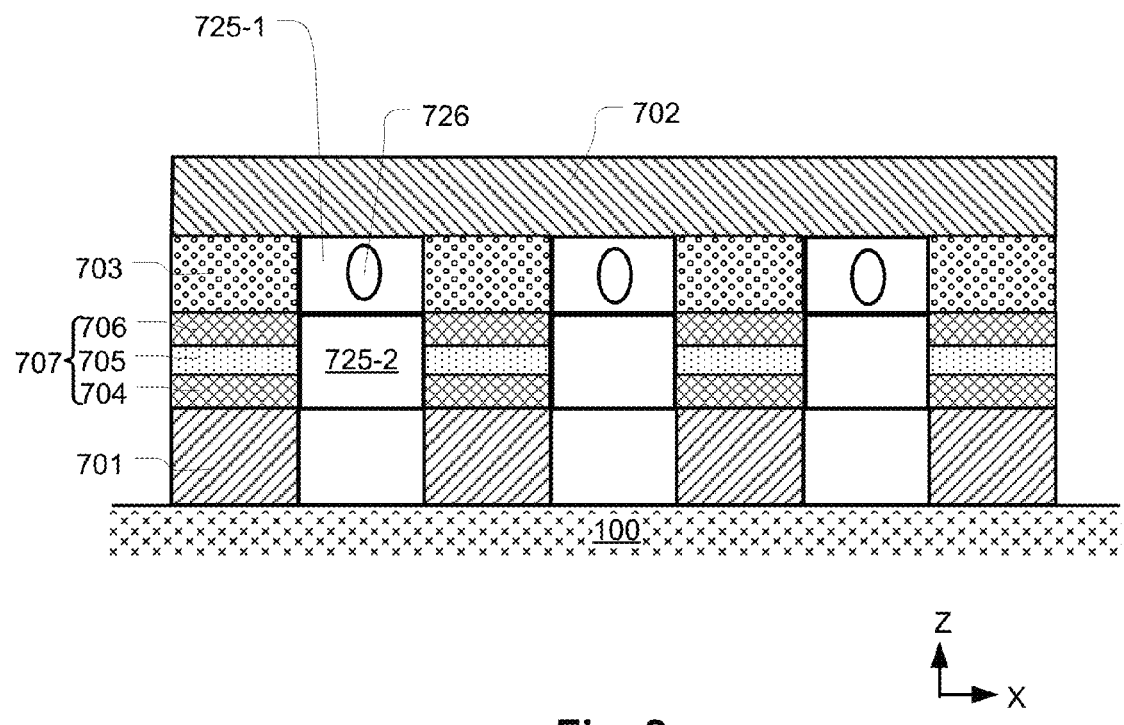

FIGS. 7 through 9 illustrate stages of an example process flow for an array of memory posts in another embodiment.

To form the illustrated embodiment of FIG. 7, the layers 704, 705, 706 of access elements 707 are formed first on the plurality of word lines, including word line 701, in the word line conductor layer over a substrate 100, and the layer 703 of memory element is then formed thereon. A mask of photoresist is patterned using standard photolithographic techniques. Next, a stack etch is applied using the mask of photoresist to form a plurality of memory posts and opening 713 therebetween. In this example, the access elements are aligned with the memory elements.

FIG. 8 illustrates a stage of the process flow after forming an interlayer insulating structure. A spin-on dielectric comprising silicon oxide, for example, is filled within opening 713 (see FIG. 7), and then a CMP process is applied. The spin-on technique is known for uniformity and easy applicability, so the CMP process can be optionally omitted. An etching process is applied to remove the spin-on dielectric at the level of memory elements so as to form second insulating layer 725-2. Next, a dielectric material, such as silicon oxide or silicon nitride, is deposited to form a first insulating layer 725-1 on second insulating layer 725-2 using chemical vapor deposition (CVD), atomic layer deposition (ALD), physical vapor deposition (PVD), low-pressure chemical vapor deposition (LPCVD) or high density plasma chemical vapor deposition (HDPCVD). By adjusting the deposition rate, temperature, and pressure, the overhangs (not shown)

may be formed on the top of the inside surface of the dielectric material when the deposition step is applied. A plurality of voids, including void 726, may be formed when two adjacent overhangs are very close or connected together such that the regions at the level of memory element cannot be completely filled by the dielectric material. After the deposition step, an etch-back or planarizing step is applied to expose the top surface to the phase change material.

FIG. 9 illustrates a stage in a process in which a plurality of bit lines, including bit line 702, is disposed in the bit line conductor layer. Detailed descriptions are included with reference to FIG. 6.

FIGS. 10 through 15 illustrate stages of an alternate process flow for an array of memory posts as described herein.

Figure 10:
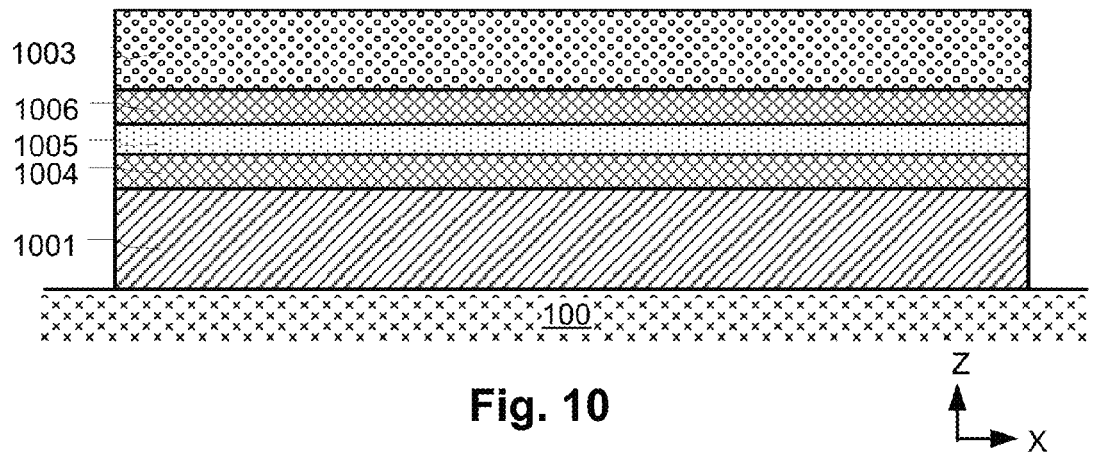
FIGS. 10, 11A, 11B, 12, 13, 14A, 14B, and 15 illustrate stages of an alternate process flow for an array of memory posts as described herein.

Referring to FIG. 10, a word line conductor layer 1001, a layer 1004 of first barrier material, a layer 1005 of chalcogenide-based material suitable for an ovonic threshold switch, a layer 1006 of second barrier material, a layer 1003 of memory material and a layer of photoresist (not shown) are sequentially formed on a substrate 100. A layer of hardmask (not shown) is optionally formed.

Figure 11A:
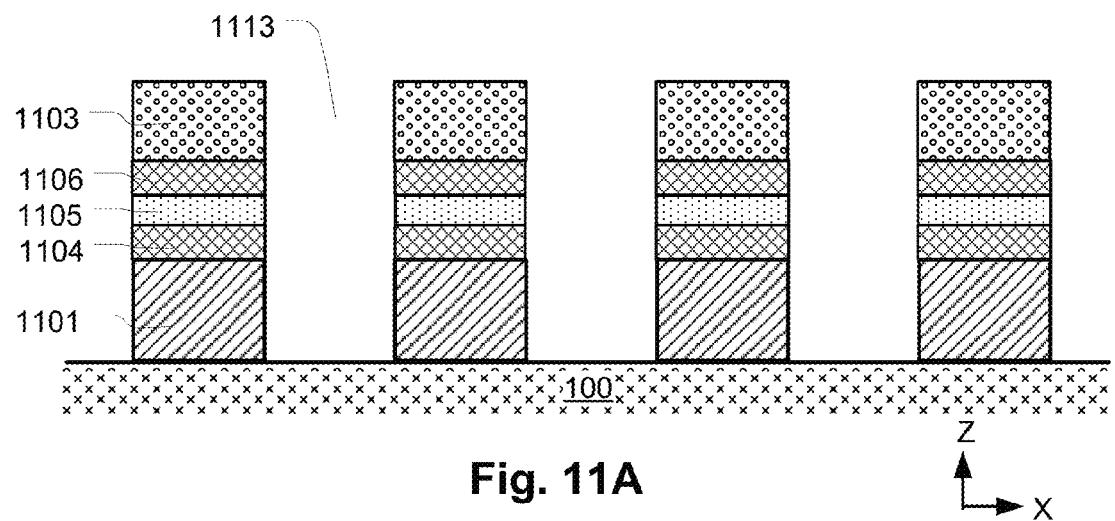
Figure 11B:
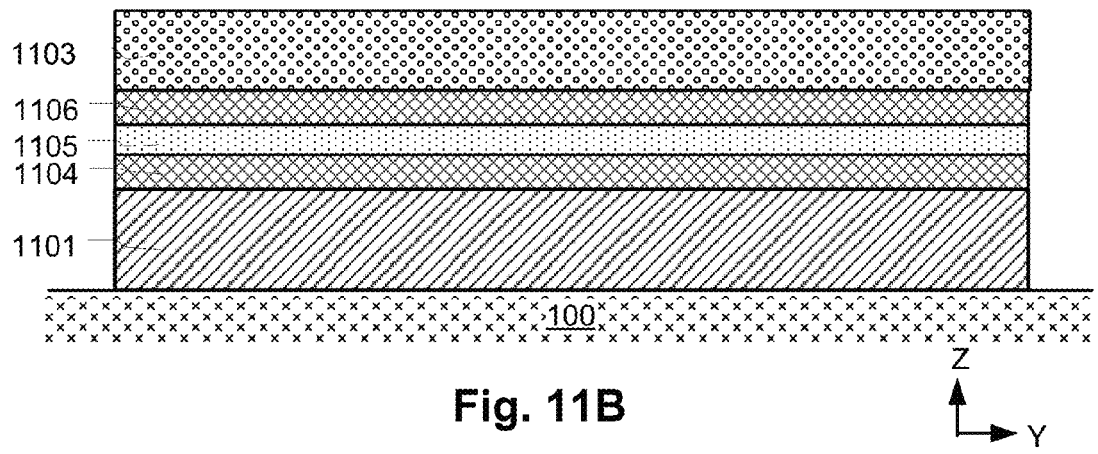

FIGS. 11A and 11B are cross-sectional views in the XZ plane and YZ plane, illustrating a stage after the formation of a plurality of stack. A trench etch is applied to the structure of FIG. 10 using an etch mask used to form a plurality of word lines, including word line 1101, resulting in a plurality of trenches, including trench 1113, along the word line direction. Each stack comprises a word line 1101, a first barrier strip 1104, a switching strip 1105, a second barrier strip 1106, and a memory material strip 1103. The etch mask can comprise a mask of photoresist, a hardmask, or a combination of photoresist and hardmask. The hardmask may comprise silicon nitride, titanium nitride, bottom anti-reflective coating (BARC), top anti-reflective coating (TARC), and other materials.

Figure 12:
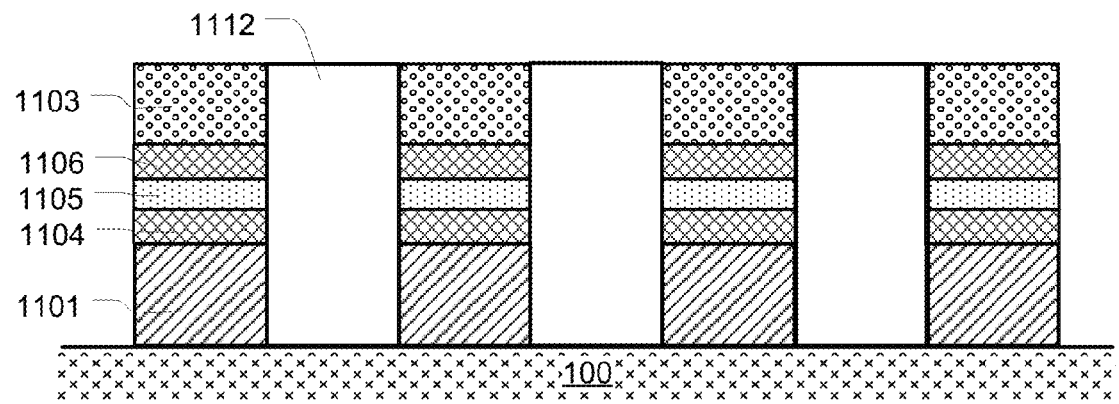

FIG. 12 illustrates a stage after applying a dielectric material 1112. A fill process is applied using a spin-on dielectric comprising silicon oxide, for example, to fill the trenches, and a CMP process is then applied. Other procedures, such as chemical vapor deposition (CVD), atomic layer deposition (ALD), physical vapor deposition (PVD), low-pressure chemical vapor deposition (LPCVD) or high density plasma chemical vapor deposition (HDPCVD) could be used to fill in the trenches.

Figure 13:
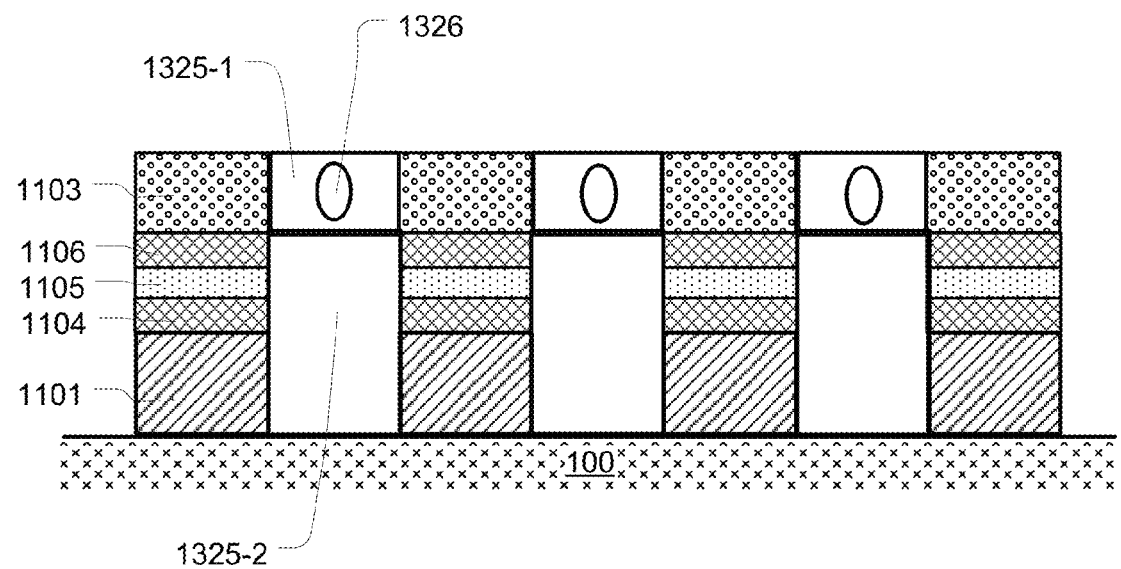

FIG. 13 illustrates a stage after formation of the interlayer insulating structure along the word lines. An etch-back process is applied to remove the spin-on dielectric at the level of the memory material strip 1103 to form the second insulating layer 1325-2. Next, a dielectric material, such as silicon oxide or silicon nitride, is deposited to form first insulating layer 1325-1 on second insulating layer 1325-2 using chemical vapor deposition (CVD), atomic layer deposition (ALD), physical vapor deposition (PVD), low-pressure chemical vapor deposition (LPCVD) or high density plasma chemical vapor deposition (HDPCVD). By adjusting the deposition rate, temperature, and pressure, the overhangs (not shown) may be formed on the top of the inside surface of the dielectric material when the deposition step is applied. A plurality of voids, including void 1326, may be formed when two adjacent overhangs are very close or connected together such that the regions at the level of memory element cannot be completely filled by the dielectric material. After the deposition step, a planarizing step is applied to expose the top surfaces of the memory material strips.

Figure 14A:
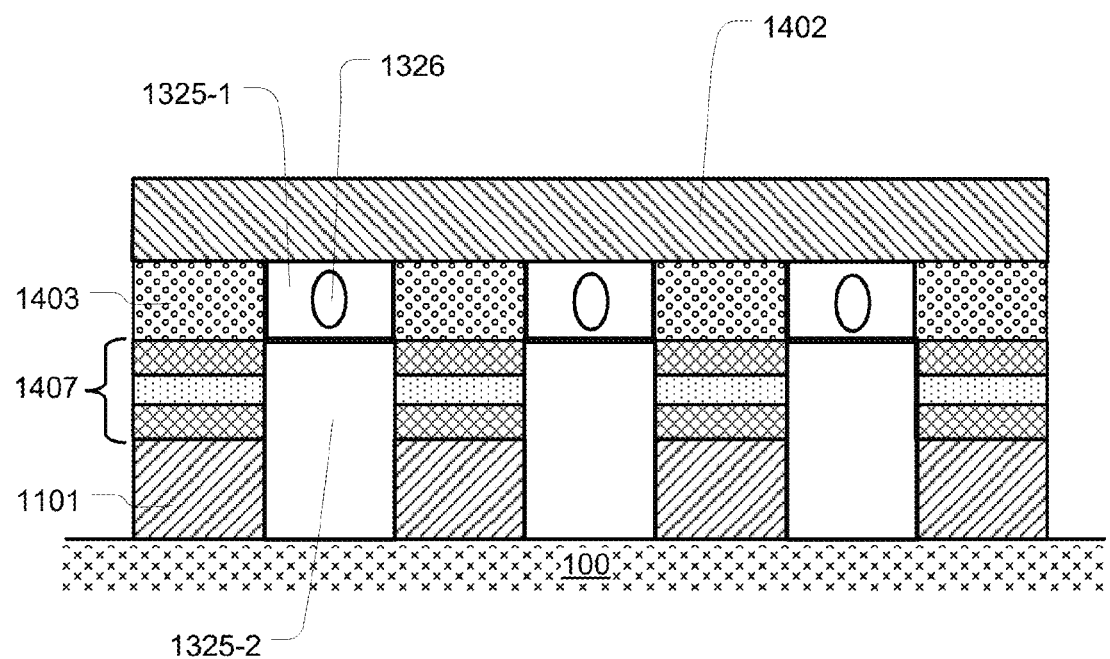
Figure 14B:
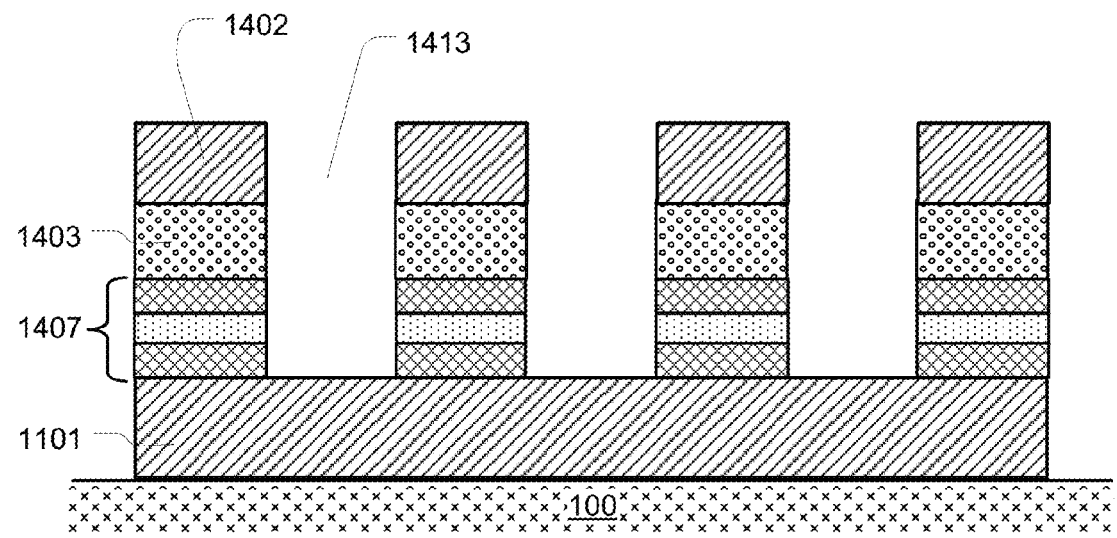

FIGS. 14A and 14B are cross-sectional views in the XZ plane and YZ plane respectively, illustrating a stage after forming a plurality of bit lines. A bit line conductor layer and a layer of photoresist (not shown) are sequentially formed over the structure of FIG. 13. A layer of hardmask (not shown) is optionally formed on the bit line conductor layer. A trench etch is applied to the structure of FIG. 13 using an etch mask used to form a plurality of bit lines, including bit line 1402, resulting a plurality of trenches, including trench 1413, along the bit line direction, and resulting a plurality of memory posts at cross-points of the word lines and bit lines. The memory posts respectively include an access element 1407 and a memory element 1403, and have a first end in contact with a bit line in the plurality of bit lines and a second end in contact with a word line in the plurality of word lines. A second level, or more levels, can be formed by repeating the steps as described herein.

The etch mask used herein can comprise a mask of photoresist, a hardmask, or combination of photoresist and hardmask. The hardmask may comprise silicon nitride, titanium nitride, bottom anti-reflective coating (BARC), top anti-reflective coating (TARC), and other materials.

Referring to FIG. 14B, a plurality of trenches, including trench 1413, is formed along the bit line direction as a result of using the bit line conductor layer as a mask.

Figure 15:
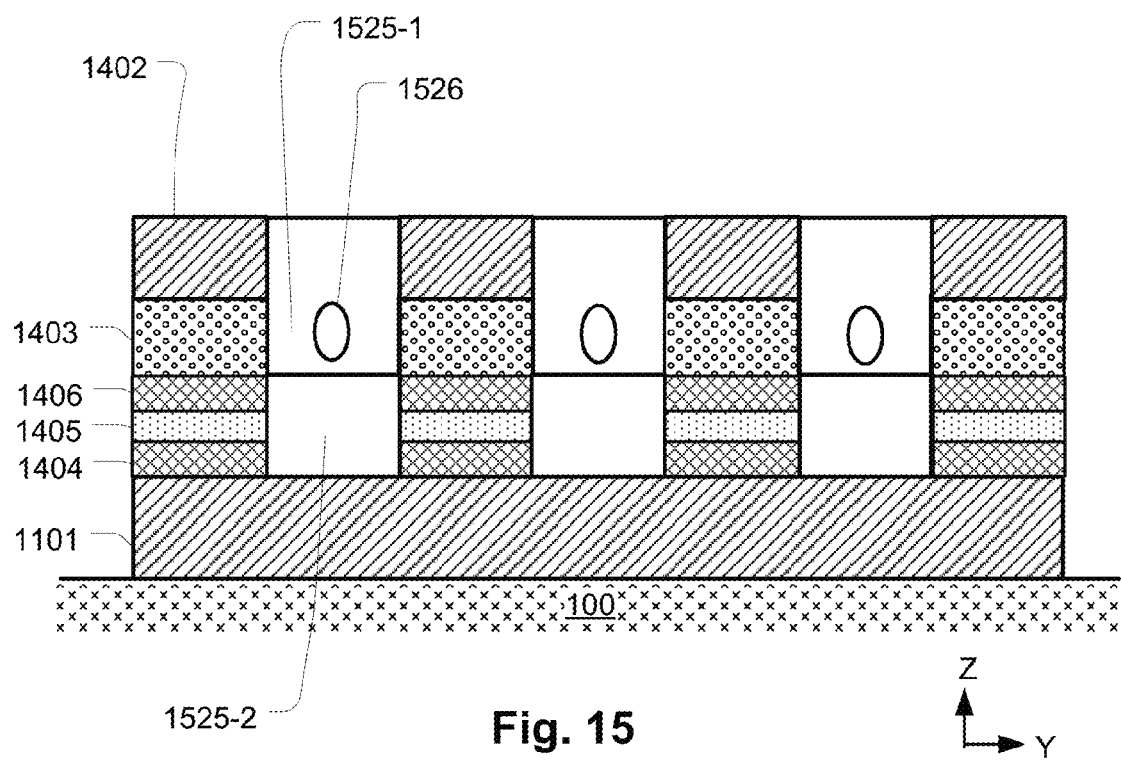

FIG. 15 is a cross-sectional view in the YZ plane, illustrating a stage after forming an interlayer insulating structure within the trenches. A spin-on dielectric comprising silicon oxide, for example, is filled within the trenches and planarized using a CMP process. Next, an etch-back process is applied to remove the spin-on dielectric at the level of memory element 1403 and bit line 1402 to form the second insulating layer 1525-2. A dielectric material, such as silicon oxide or silicon nitride, is deposited to form first insulating layer 1525-1 on second insulating layer 1525-2 using chemical vapor deposition (CVD), atomic layer deposition (ALD), physical vapor deposition (PVD), low-pressure chemical vapor deposition (LPCVD) or high density plasma chemical vapor deposition (HDPCVD). By adjusting the deposition rate, temperature, and pressure, the overhangs (not shown) may be formed on the top of the inside surface of the dielectric material when the deposition step is applied. A plurality of voids, including void 1526, may be formed when two adjacent overhangs are very close or connected together such that the regions at the level of memory element cannot be completely filled by the dielectric material. After the deposition step, a planarizing step is applied to expose the top surfaces of the bit lines.

Figure 16:
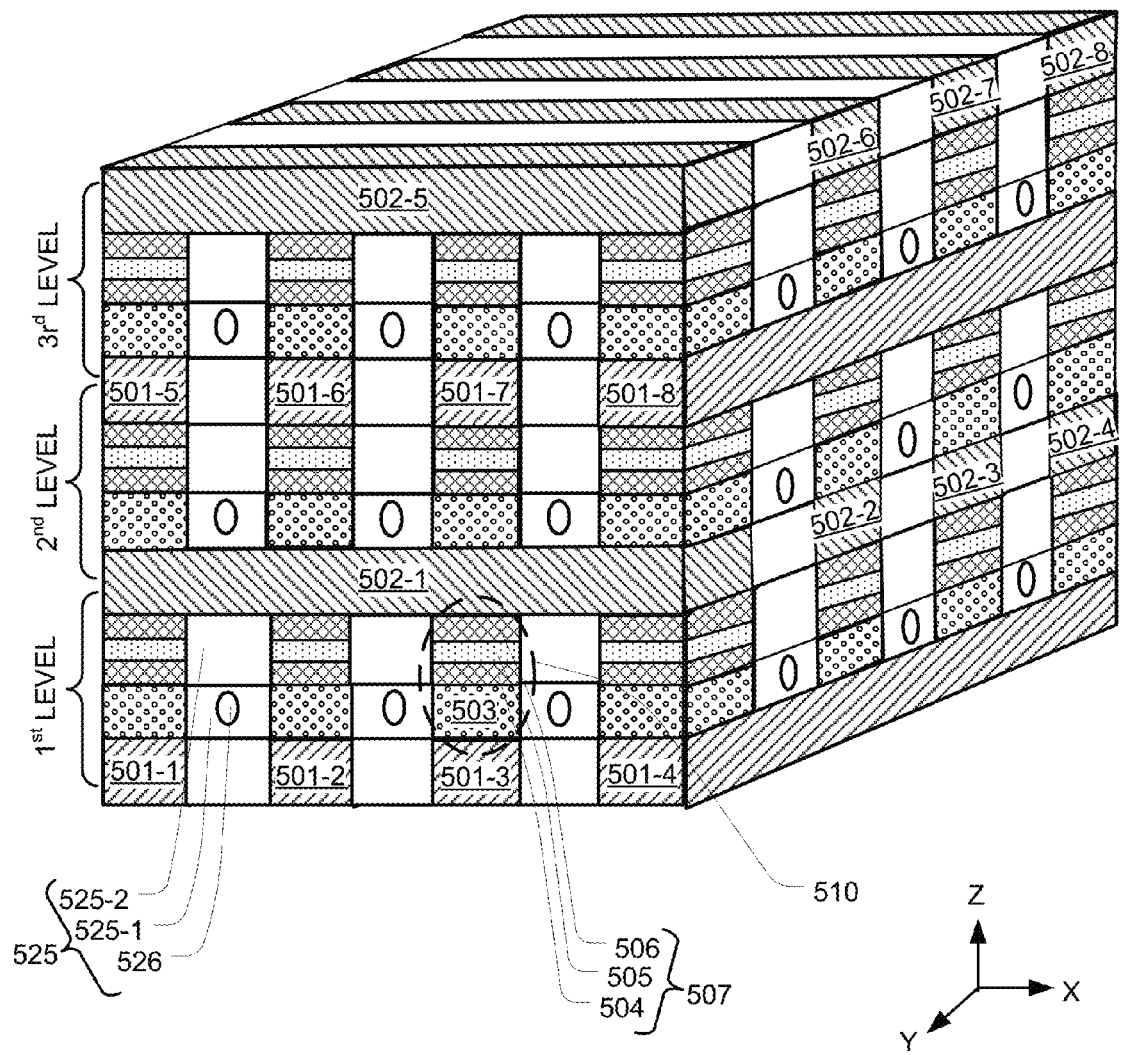
FIG. 16 is a perspective view of a 3D block comprising an array of memory posts as describe herein.

FIG. 16 is a perspective view of a 3D block comprising the memory array as described herein. The three-dimensional array comprises a plurality of bit line conductor layers and a plurality of word line conductor layers interleaved with the plurality of bit line conductor layers. Each bit line conductor layer in the plurality of bit line conductor layers has a plurality of bit lines (e.g. 502-1, 502-2, 502-3, and 502-4) disposed therein and each word line conductor layer in the plurality of word line conductor layers has a plurality of word lines (e.g. 501-1, 501-2, 501-3, and 501-4) disposed therein. The three-dimensional array comprises a plurality of intermediate layers, each intermediate layer being disposed between one of the bit line conductor layers and one of the word line conductor layers. Each intermediate layer in the plurality includes an interlayer insulating structure (e.g. 525) and an array of memory posts (e.g. 510) through the interlayer insulating structure. Each memory post in the array has a first end in contact with a bit line in the plurality of bit lines disposed in an adjacent bit line conductor layer, and a second end in contact with a word line in the plurality of word lines disposed in an adjacent word line conductor layer, and the memory posts respectively include an ovonic threshold switch and a phase change memory element arranged in respective levels of the intermediate layer. The interlayer insulating structure has higher thermal resistance at the level of the phase change memory elements than at the level of the ovonic threshold switches.

In the illustration of FIG. 16, a first plurality of word lines, including word lines 501-1, 501-2, 501-3, and 501-4, is disposed in a first word line conductor layer in the first level, and a second plurality of word lines, including word lines 501-5, 501-6, 501-7, and 501-8, is disposed in a second word line conductor layer. A first plurality of bit lines, including bit lines 502-1, 502-2, 502-3, and 502-4, is disposed in a first bit line conductor layer between the first word line and the second word line conductor layers. Further, a second plurality of bit lines, including bit lines 502-5, 502-6, 502-7, and 502-8, is disposed in a second bit line conductor layer. An first intermediate layer is disposed between the first bit line and first word line conductor layers, and a second intermediate layer is disposed between the first bit line and second word line conductor layers, and a third intermediate layer is disposed between the second word line and second bit line conductor layers.

The first intermediate layer in the first level includes a first interlayer insulating structure and a first plurality of memory posts, including memory post 510, through the first interlayer insulating structure 507, each memory post in the first plurality of memory posts having one end in contact with a bit line in the first plurality of bit lines disposed in the first bit line conductor layer, and a second end in contact with a word line in the first plurality of word lines disposed in the first word line conductor layer. The memory posts respectively include an access element 507 and a memory element 503 arranged in the first intermediate layer. The access element 507 can comprises an ovonic threshold switch including a first barrier layer 504, a switching layer 505, and a second barrier layer 506. The first interlayer insulating structure has higher thermal resistance at the level of the memory elements in the first plurality of memory posts than at the level of the access elements in the first plurality of memory posts.

The second intermediate layer in the second level includes a second interlayer insulating structure and a second plurality of memory posts through the second interlayer insulating structure, each memory post in the second plurality of memory posts having one end in contact with a bit line in the first plurality of bit lines disposed in the first bit line conductor layer, and a second end in contact with a word line in the second plurality of word lines disposed in the second word line conductor layer. The memory posts respectively include an access element and a memory element arranged in the second intermediate layer, the second interlayer insulating structure having higher thermal resistance at the level of the memory elements in the second plurality of memory posts than at the level of the access elements in the second plurality of memory posts.

The third intermediate layer in the third level includes a third interlayer insulating structure and a third plurality of memory posts through the third interlayer insulating structure, each memory post in the third plurality of memory posts having one end in contact with a bit line in the second plurality of bit lines disposed in the second bit line conductor layer, and a second end in contact with a word line in the second plurality of word lines disposed in the second word line conductor layer. The memory posts respectively include an access element and a memory element arranged in the third intermediate layer, the third interlayer insulating structure having higher thermal resistance at the level of the memory elements in the third plurality of memory posts than at the level of the access elements in the third plurality of memory posts.

The interlayer insulating structure in at least one of the plurality of intermediate layers includes a first insulating layer and a second insulating layer, the first insulating layer having higher thermal resistance than the second insulating layer. In this example, the first insulating layer (e.g. 525-1) comprises a dielectric material having a plurality of voids (e.g. 526) at the level of the memory elements and the second insulting layer (e.g. 525-2) comprises a solid dielectric material without voids. In another example, the first and second insulating layers comprise different solid dielectric materials.

The overall array implemented in the configuration of FIG. 16 can have many levels, and many bit lines and word lines in each level for formation of very high density memory devices. Other 3D configurations can be implemented, including a three-dimensional array in which, like the structure of FIG. 16, the plurality of word lines and the plurality of bit lines are arranged for access to multiple levels of memory cells.

Figure 17:
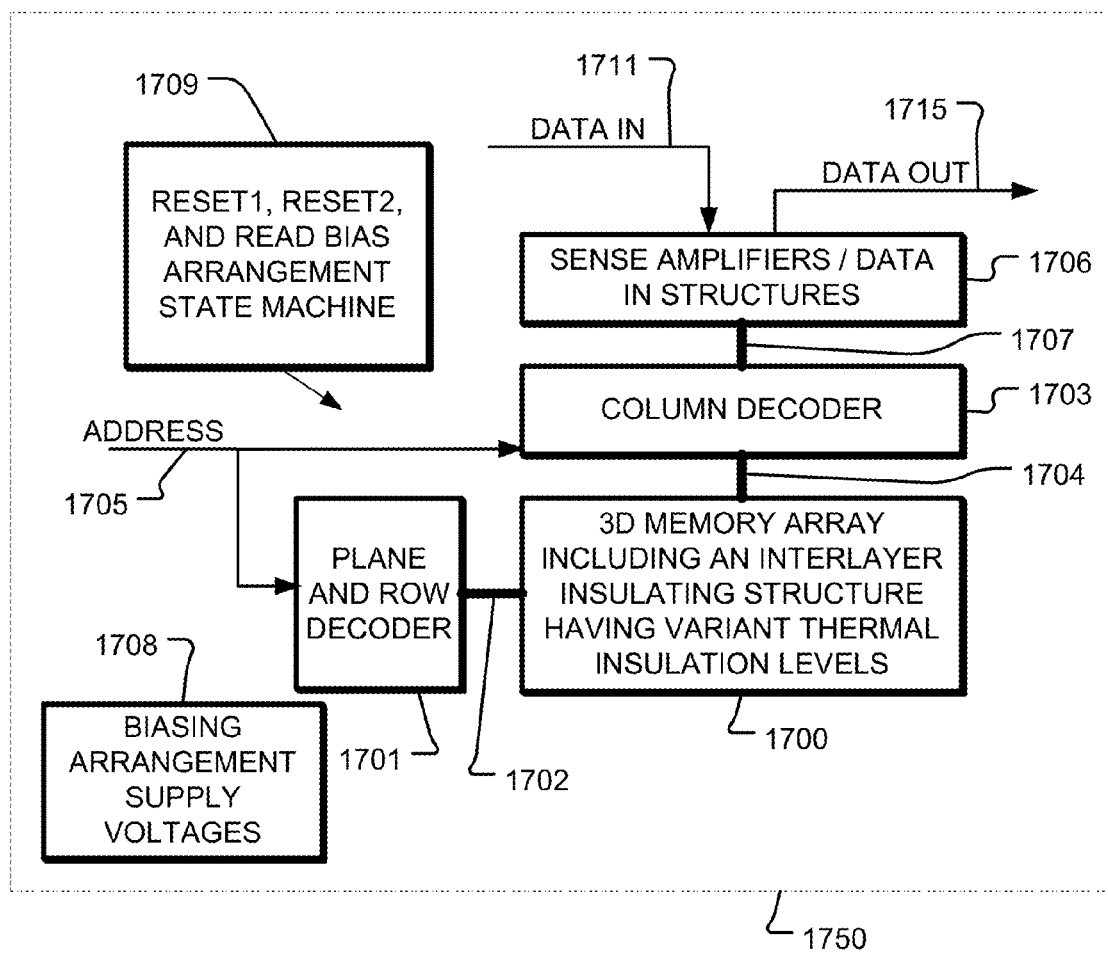

FIG. 17 shows an integrated circuit 1750 including a 3D memory array 1700 comprising an interlayer insulating structure having two portions with different thermal conductivities, as stated in the figure having variant thermal insulation levels. A plane and row decoder 1701 is coupled to, and in electrical communication with, a plurality of word lines 1702, and arranged along rows in the memory array 1700. A column decoder 1703 is coupled to and in electrical communication with a plurality of bit lines 1704 arranged along columns in the memory array 1700 for reading data from, and writing data to, the memory cells in the 3D memory array 1700. Addresses are supplied on bus 1705 to the plane and row decoder 1701 and to the column decoder 1703. Sense amplifiers and other supporting circuitry such as pre-charge circuits and so on, along with data-in structures in block 1706, are coupled to the column decoder 1703 via the bus 1707. Data is supplied via the data-in line 1711 from input/output ports on the integrated circuit 1750 or other data sources, to the data-in structures in block 1706. Data is supplied via the data-out line 1715 from the sense amplifiers in block 1706 to input/output ports on the integrated circuit 1750, or to other data destinations internal or external to the integrated circuit 1750. A bias arrangement state machine is in circuitry 1709, controlling biasing arrangement supply voltages 1708, and the sense circuitry and the data-in structures in block 1706, for read and write operations. The circuitry can be implemented using special purpose logic, a general purpose processor or a combination thereof, configured to execute the read, write and erase operations.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit, comprising:
   a plurality of bit lines disposed in a bit line conductor layer and a plurality of word lines disposed in a word line conductor layer; and an intermediate layer between the bit line conductor layer and the word line conductor layer;

the intermediate layer including an interlayer insulating structure and a plurality of memory posts through the insulating structure, each memory post in the plurality of memory posts having a first end in contact with a bit line in the plurality of bit lines, and a second end in contact with a word line in the plurality of word lines, the memory posts respectively including an access element and a memory element arranged in the interlayer insulating structure; and the interlayer insulating structure having higher thermal resistance at the level of the memory elements than at the level of the access elements.

2. The integrated circuit of claim 1, wherein the interlayer insulating structure comprises a plurality of voids at the level of the memory elements.

3. The integrated circuit of claim 1, wherein the interlayer insulating structure includes a first insulating layer at the level of the memory elements and a second insulating layer at the level of the access elements, the first insulating layer having higher thermal resistance than the second insulating layer.

4. The integrated circuit of claim 3, wherein the first insulating layer comprises a dielectric material having a plurality of voids.

5. The integrated circuit of claim 3, wherein the first insulating layer comprises a dielectric material having a plurality of voids, and the second insulating layer comprises a solid dielectric material without voids.

6. The integrated circuit of claim 3, wherein the first and second insulating layers comprise different solid dielectric materials.

7. The integrated circuit of claim 1, wherein the memory element comprises a phase change material and the access element comprises an ovonic threshold switch.

8. The integrated circuit of claim 1, wherein the memory element comprises a programmable resistance material.

9. The integrated circuit of claim 1, comprising a second plurality of word lines disposed in a second word line conductor layer; and a second intermediate layer between the bit line conductor layer and the second word line conductor layer;

the second intermediate layer including a second interlayer insulating structure and a second plurality of memory posts through the second interlayer insulating structure, each memory post in the second plurality of memory posts having one end in contact with a bit line in the plurality of bit lines, and a second end in contact with a word line in the second plurality of word lines, the memory posts respectively including an access element and a memory element arranged in the second intermediate layer; and the second interlayer insulating structure having higher thermal resistance at the level of the memory elements in the second plurality of memory posts than at the level of the access elements in the second plurality of memory posts.

10. An integrated circuit, comprising:

a plurality of bit line conductor layers and a plurality of word line conductor layers interleaved with the plurality of bit line conductor layers, each bit line conductor layer in the plurality of bit line conductor layers having a plurality of bit lines disposed therein and each word line conductor layer in the plurality of word line conductor layers having a plurality of word lines disposed therein; and a plurality of intermediate layers, each intermediate layer being disposed between one of the bit line conductor layers and one of the word line conductor layers;

each intermediate layer in the plurality including an interlayer insulating structure and an array of memory posts through the interlayer insulating structure, each memory post in the array having a first end in contact with a bit line in the plurality of bit lines disposed in an adjacent bit line conductor layer, and a second end in contact with a word line in the plurality of word lines disposed in an adjacent word line conductor layer, the memory posts respectively including an ovonic threshold switch and a phase change memory element arranged in respective levels of the intermediate layer; and the interlayer insulating structure having higher thermal resistance at the level of the phase change memory elements than at the level of the ovonic threshold switches.

11. The integrated circuit of claim 10, wherein the interlayer insulating structures in the plurality of intermediate layers respectively comprise a dielectric material having a plurality of voids at the level of the memory elements.

12. The integrated circuit of claim 10, wherein the interlayer insulating structure in at least one of the plurality of intermediate layers includes a first insulating layer at the level of the phase change memory elements and a second insulating layer at the level of the ovonic threshold switches, the first insulating layer having higher thermal resistance than the second insulating layer.

13. The integrated circuit of claim 12, wherein the first insulating layer comprises a dielectric material having a plurality of voids.

14. The integrated circuit of claim 12, wherein the first insulating layer comprises a dielectric material having a plurality of voids, and the second insulating layer comprises a solid dielectric material without voids.

15. A method of manufacturing an integrated circuit, comprising:

forming a plurality of bit lines disposed in a bit line conductor layer and forming a plurality of word lines disposed in a word line conductor layer; and forming an intermediate layer between the bit line conductor layer and the word line conductor layer;

wherein said forming the intermediate layer includes forming an interlayer insulating structure and forming a plurality of memory posts through the interlayer insulating structure, each memory post in the plurality of memory posts having a first surface in contact with a bit line in the plurality of bit lines, and a second surface in contact with a word line in the plurality of word lines, the memory posts respectively including an access element and a memory element arranged in the interlayer insulating structure, the interlayer insulating structure having higher thermal resistance at the level of the memory elements than at the level of the access elements.

16. The method of claim 15, wherein said forming the interlayer insulating structure comprises forming a plurality of voids at the level of the memory elements.

17. The method of claim 15, wherein said forming the interlayer insulating structure includes forming a first insulating layer and forming a second insulating layer, the first insulating layer having a higher thermal resistance than the second insulating layer.

18. The method of claim 17, wherein said forming the first insulating layer comprises a dielectric material having a plurality of voids.

19. The method of claim 15, wherein said forming the plurality of memory posts through the insulating structure includes using an etch mask used to form the plurality of word lines and using an etch mask used to form the plurality of bit lines so as to form said posts at cross-points of the word lines and bit lines.

20. The method of claim 15, wherein said forming the interlayer insulating structure includes after etching using an etch mask used to form one of the plurality of bit lines and the plurality of word lines, using a fill process to form the interlayer insulating structure.

* * * * *